United States Patent
Voss

(10) Patent No.: US 6,252,819 B1
(45) Date of Patent: Jun. 26, 2001

(54) REDUCED LINE SELECT DECODER FOR A MEMORY ARRAY

(75) Inventor: Peter H. Voss, Aromas, CA (US)

(73) Assignee: SandCraft, Inc., Santa Clara, CA (US)

( * ) Notice: Subject to any disclaimer, the term of this patent is extended or adjusted under 35 U.S.C. 154(b) by 0 days.

(21) Appl. No.: 09/562,058

(22) Filed: May 1, 2000

(51) Int. Cl.[7] .................................................. G11C 8/00
(52) U.S. Cl. ...................................... 365/230.06; 365/190
(58) Field of Search .............................. 365/230.06, 190, 365/189.01

(56) References Cited

U.S. PATENT DOCUMENTS

| | | | | |
|---|---|---|---|---|
| 4,916,668 | * | 4/1990 | Matsui | 365/230.06 |
| 4,954,992 | * | 9/1990 | Kumanoya et al. | 365/189.01 |
| 5,010,521 | * | 4/1991 | Matsui | 365/189.01 |
| 5,367,492 | * | 11/1994 | Kawamoto et al. | 365/190 |
| 5,381,367 | * | 1/1995 | Kajimoto | 365/189.01 |
| 5,497,352 | * | 3/1996 | Magome | 365/230.06 |
| 5,675,548 | * | 10/1997 | Yokoyama | 365/189.01 |
| 5,896,342 | * | 4/1999 | Nakao | 365/230.06 |
| 5,963,500 | * | 10/1999 | Taura et al. | 365/230.06 |
| 6,067,264 | * | 5/2000 | Kwon | 365/230.06 |

* cited by examiner

*Primary Examiner*—Tan T. Nguyen
(74) *Attorney, Agent, or Firm*—Fernandez & Associates, LLP

(57) ABSTRACT

A reduced line select decoder for a memory array provided comprising a plurality of memory cells arranged at least in one column, a bit line pair connected to the memory cells arranged in one column, a sense amplifier coupled to a bit line pair for differentially amplifying the voltages on the bit line pair in accordance with the voltage on the sense drive line, and a sense amplifier control input responsive to activation of a sense instructing signal to latch data into the sense amplifier and a pair of read/write control signals to select and provide a read/write operation to a selected bit line and connecting to write buffer.

6 Claims, 2 Drawing Sheets

200

REDUCED LINE SELECT DECODER FOR A MEMORY ARRAY

FIELD OF INVENTION

This invention relates to semiconductor memory devices and particularly to a line select decoder for a memory array.

BACKGROUND OF INVENTION

FIG. 1 schematically shows a typical circuit of a 2-to-1 line decoder for a dynamic semiconductor memory device in the prior art. P-channel MOS transistors P1 204 and P3 206 together with N-channel MOS transistors N1 208 and N3 210 are transfer devices that connect a bit line pair BIT 200 and /BIT 201 to a sense amplifier and write circuit blocks. P-channel MOS transistors P2 205 and P4 207 and N-channel MOS transistors N2 209 and N4 211 likewise connect BIT2 202 and /BIT2 203 to the same ports of the sense amplifier and write blocks. To selectively transfer the column bit line pairs BIT 200 and /BIT 201 or BIT2 202 and /BIT2 203 to the sense amplifier for either a read or write operation, it is necessary to activate four separate control lines for reading and writing, namely, WY0 216, WY1 217, RY0 214 and RY1 215. In the interest of conserving chip real estate and performance it is as usual always desirable to provide a simplified bit line decoder with improved efficiency for either a read or a write operation.

SUMMARY OF INVENTION

An object of the invention is to minimize the amount of line select control signals needed to transfer data between a memory array and a sense amplifier or a write buffer.

Another object of the invention is to achieve a fast transfer of data between a memory array and a sense amplifier or a write buffer. In accordance with the principles of this invention, a semiconductor memory device is provided comprising a pair of bit line select control signals to select a bit line from an array of memory cells for a read/write operation on the selected bit line. In the preferred embodiment, both the true and complementary signal associated with the selected bit line are selected. A sense amplifier is coupled to the selected bit line via a P-type transistor for differentially amplifying the voltages on the selected bit line in accordance with the voltage on the sense drive line. The sense amplifier is coupled to receive a sense amplifier control input responsive to activation of a sense instructing signal during a read operation to latch data into the sense amplifier. A write buffer is also coupled to the selected bit line via an N-type transistor, responsive to a write control signal to write to the selected bit line during a write operation.

DETAILED DESCRIPTION OF PREFERRED EMBODIMENT(S)

Figure 1:
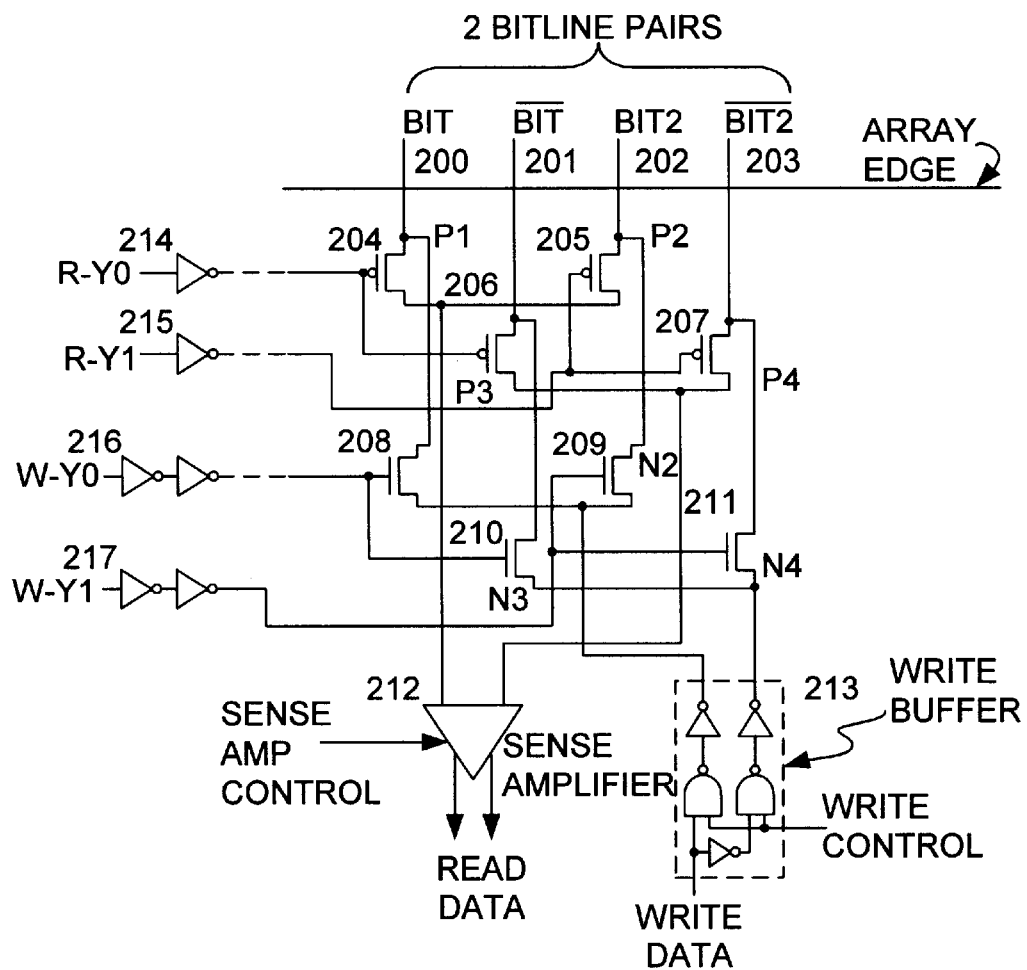
FIG. 1 shows a typical circuit diagram of a prior art line selection decoder.
Figure 2:
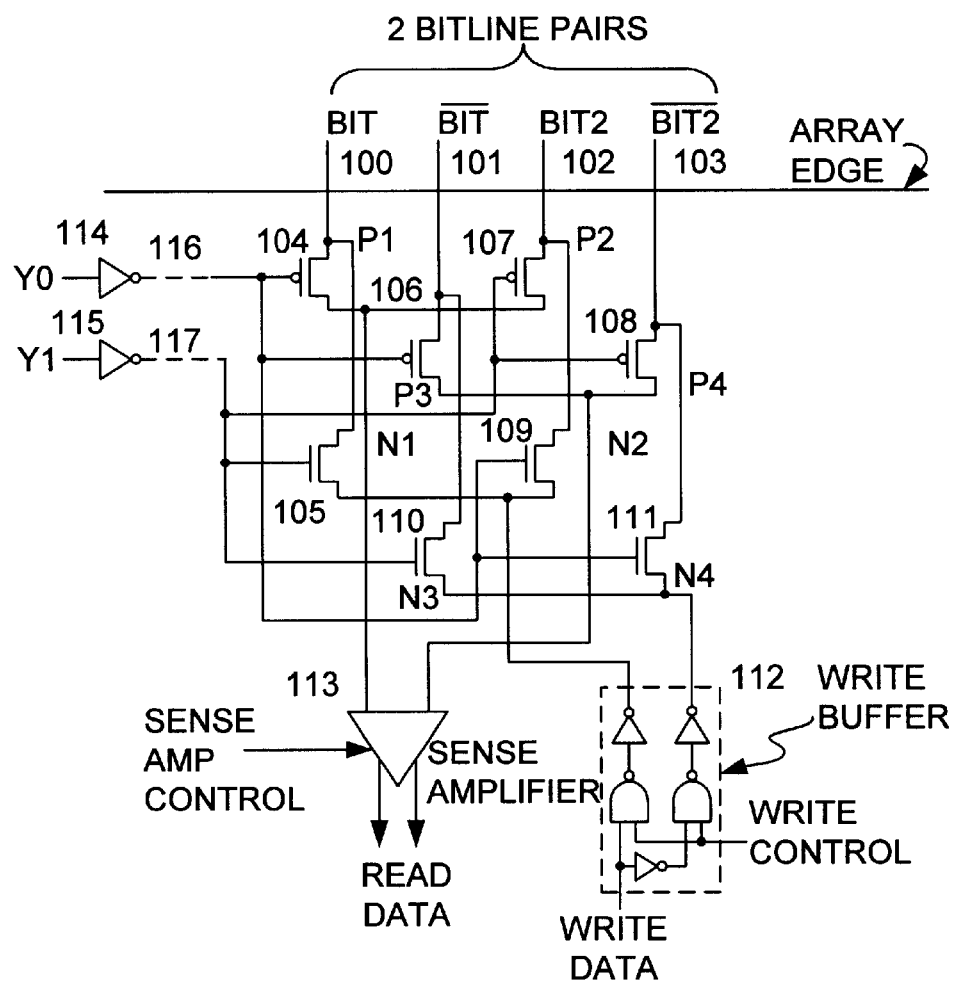
FIG. 2 shows a circuit diagram of a line selection decoder according to the principles of this invention.

FIG. 2 shows a circuit diagram illustrating a column decoder circuit 200 for a semiconductor memory device in accordance with the invention. In the preferred embodiment, column decoder circuit 200 comprises transfer transistors, such as PMOS transistors P1 104 and P3 106 and NMOS transistors N1 105 and N3 110 for transferring memory array data from true and complementary bit line pairs BIT 100 and /BIT 101 to a sense amplifier 113 or a write buffer 112. Likewise, transfer transistors or PMOS transistors P2 107 and P4 108 and NMOS transistors N2 109 and N4 111 transfer memory array data from true and complementary bit line pairs BIT2 102 and /BIT2 103 array to sense amplifier 113 or the write buffer 112. Sense amplifier 113 and write buffer 112 comprises typical sense amplifier circuit and write buffer circuit both of which are known to those skilled in the art and thus need not be further elaborated here.

In the preferred embodiment, reduced line select decoder 200 comprises a pair of bit line select control signals Y0 114 and Y1 115 to select a bit line from an array of memory cells comprising, for example, BIT 100 and BIT2 102, for a read/write operation on the selected bit line. In the preferred embodiment, both the true, i.e., BIT and complementary signal, i.e., /BIT, associated with the selected bit line BIT are selected. A sense amplifier 113 is coupled to the selected bit line via a first P-type transistor P1 104 for differentially amplifying the voltages on the selected bit line in accordance with the voltage on the sense drive line. The sense amplifier 113 is coupled to receive an input sense amplifier control signal responsive to activation of a read operation to latch data into the sense amplifier 113. A write buffer 112 is also coupled to the selected bit line via an N-type transistor, N1 105 or N2 109 responsive to a write control signal to write to the selected bit line during a write operation.

In a read operation on bit line pair BIT 100 and /BIT 101, for instance, a first bit line select signal Y0 114 will be at a logic high state (H) while a second bit line select signal Y1 115 will be at a logic low state (L). Inverter circuit I1 116 inverts the logic high state (H) of Y0 114 into logic low state (L). The logic low output of inverter circuit I1 is connected to the gates of PMOS transistors P1 104 and P3 106 and to the gates of NMOS transistors N2 109 and N4 111. When the output of inverter circuit I1 is at a logic low state (L), transistors P1 104, P3 106, and N2 109, N4 111 are turned off. As a result, P1 104 transfers line BIT 100 to the first input of the sense amplifier 113 and P3 106 transfers line /BIT 101 to the second input of the sense amplifier 113. The write buffer 112 is disabled providing a logic high on the inputs of N2 109 and N4 111 which are turned on in a read cycle. The read is not affected until the data on BIT 100 is lower than a N-channel's threshold voltage. The data is sensed by the sense amplifier 113 before it clamps the voltage level on BIT 100 or/BIT 101.

During the write operation on bit line pair BIT 100 and /BIT 101, bit line select signal Y1 115 is inverted by inverter circuit I2 117 to a logic high state. The logic high output of inverter I2 117 is connected to the gates of PMOS transistors P2 107 and P4 108 and to the gates of NMOS transistors N1 105 and N3 110. When the output of inverter circuit I2 117 is at a logic high state, transistors P2 107, P4 108, are turned off. As a result, bit line pair BIT2 102 and /BIT2 103 are blocked from the sense amplifier 113 and write buffer 112.

As is apparent from the above description and according to the invention, by placing bit line select signals Y0 114 and Y1 115 in various logic states, the appropriate transfer transistors will be turned on to transfer the desired bit line pair to either the sense amplifier, for a read operation, or to the write buffer, for a write operation. Accordingly, reduced line select decoder 200 provides a simplified and more efficient line decoder in accordance with the principles of this invention, which not only further minimize critical chip real estate, but helps increase chip performance. Moreover, a more efficient write operation via N-channel transistors and read operation via P-type transistor allow even writing and reading within one cycle, while the N-channels can be a load during a read operation.

It is further envisioned as within the scope of this invention that the principles of the reduced line select decoder can be applied to $2^n$ to n line decoding. Moreover, it is contemplated that the principles of the reduced line select decoder in accordance with the invention can be applied using other appropriate transfer type switches and is therefore not intended to be limited to the described n-channel or p-channel MOS transistor implementation described.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A reduced line select decoder for selecting a bit line pair from a pair of bit line pairs to perfrom a read or write operation on the selected bit line pair comprising:
    a pair of bit line select signals for selecting a bit line pair, the pair of bit line select signals coupled to the bit lines via P-type and N-type transfer device pairs, each transfer device having a controlled current path and a control terminal, the controlled current path of each P-type transfer device coupled between a bit line pair and a sense amplifier, the controlled current path of each N-type transfer device coupled between a bit line pair and a write buffer,
    wherein the sense amplifier is coupled to receive a sense amplifier control signal to activate a read operation on the selected bit line via a coupled P-type transfer device, and providing a read data output from the sense amplifier associated with the selected bit line,
    wherein the write buffer is coupled to receive a write control signal to activate a write operation on the selected bit line via a coupled N-type transfer device.

2. The circuit according to claim 1 wherein each P-type transfer device is a PMOS transistor.

3. The circuit according to claim 1 wherein each N-type transfer device is an NMOS transistor.

4. The line decoder of claim 1 wherein a write operation and a read operation is provided in one cycle.

5. A 2-to 1 memory array column decoder circuit for selecting one of two bit line pairs from a memory array comprising:
    a sense amplifier for sensing and amplifying data from the bit line pairs;
    a write buffer for writing data to the bit line pairs;
    a first bit line select line;
    a second bit line select line;
    a first pair of PMOS transistors, each PMOS transistor having a controlled current path and a control terminal, the controlled current path of each PMOS transistor coupled between a first bit line pair and the sense amplifier, the control terminal of each first pair of PMOS transistors coupled to the first bit line select line;
    a second pair of PMOS transistors, each PMOS transistor having a controlled current path and a control terminal, the controlled current path of each PMOS transistor coupled between a second bit line pair and the sense amplifier, the control terminal of each second pair of PMOS transistors coupled to the second bit line select line;
    a first pair of NMOS transistors, each NMOS transistor having a controlled current path and a control terminal, the controlled current path of each NMOS transistor coupled between a first bit line pair and the write butter, the control terminal of each first pair of NMOS transistors coupled to the first bit line select line; and
    a second pair of NMOS transistors, each NMOS transistor having a controlled current path and a control terminal, the controlled current path of each NMOS transistor coupled between a second bit line pair and the write buffer, the control terminal of each second pair of NMOS transistors coupled to the second bit line select line.

6. A method of selecting a bit line pair in a memory array for a read or write operation comprising:
    providing a pair of bit line select signals to select a pair of bit lines and to control the selection of a pair of P-type transistors, each P-type transistor coupled to a pair of bit lines in the memory array and to a sense amplifier, each P-type transistor also coupled to a write buffer via an N-type transistor; and
    generating a read or write operation on the selected pair of bit lines in response to receiving a read or write control signal.

* * * * *